(12) United States Patent
Nozaki

(10) Patent No.: US 8,232,580 B2
(45) Date of Patent: Jul. 31, 2012

(54) SEMICONDUCTOR DEVICE

(75) Inventor: Yoshiaki Nozaki, Iga (JP)

(73) Assignee: Sharp Kabushiki Kaisha, Osaka (JP)

( * ) Notice: Subject to any disclaimer, the term of this patent is extended or adjusted under 35 U.S.C. 154(b) by 1262 days.

(21) Appl. No.: 11/889,135

(22) Filed: Aug. 9, 2007

(65) Prior Publication Data

US 2008/0035954 A1    Feb. 14, 2008

(30) Foreign Application Priority Data

Aug. 10, 2006    (JP) .................................. 2006-218180

(51) Int. Cl.
*H01L 31/0224*    (2006.01)

(52) U.S. Cl. ............ 257/187; 257/184; 257/80; 257/84; 257/76; 257/78; 257/E21.09; 257/E21.002; 438/60; 438/48; 438/47; 438/75

(58) Field of Classification Search .................. 257/187, 257/184, E31.124, 80, 84, 76, 78, E21.09, 257/E21.002; 438/60, 48, 47, 75

See application file for complete search history.

(56) References Cited

U.S. PATENT DOCUMENTS

| 2006/0033129 A1 | 2/2006 | Mouli |
| 2006/0267030 A1* | 11/2006 | Yamazaki et al. ............... 257/83 |
| 2007/0045672 A1* | 3/2007 | Nishi et al. ..................... 257/257 |

FOREIGN PATENT DOCUMENTS

| JP | 2006-73775 A | 3/2006 |
| JP | 2006073775 A * | 3/2006 |

* cited by examiner

*Primary Examiner* — Junghwa M Im

(74) *Attorney, Agent, or Firm* — Birch, Stewart, Kolasch & Birch, LLP

(57) ABSTRACT

A semiconductor device includes a photodiode formed using a silicon substrate, a wide-bandgap semiconductor layer formed on the silicon substrate and having a bandgap larger than that of silicon, and a switching element formed using the wide-bandgap semiconductor layer. The switching element is electrically connected to the photodiode so as to be on/off-controlled by a control signal from the photodiode.

18 Claims, 6 Drawing Sheets

SEMICONDUCTOR DEVICE

This nonprovisional application is based on Japanese Patent Application No. 2006-218180 filed with the Japan Patent Office on Aug. 10, 2006 the entire contents of which are hereby incorporated by reference.

BACKGROUND OF THE INVENTION

1. Field of the Invention

The present invention relates to a semiconductor device and more particularly to improvement of a power semiconductor device formed using so-called wide-bandgap semiconductor such as silicon carbide (SiC), GaN, and diamond.

2. Description of the Background Art

A schematic block diagram in FIG. 10 conceptually shows an inverter used in motor control, which is disclosed in Japanese Patent Laying-Open No. 2006-073775 as an example of power module including power semiconductor devices according to a prior art.

As shown in FIG. 10, in a case where a semiconductor element (power element) for controlling a motor 31 or the like is included in an IC or a module, it is technically difficult to integrate in one chip or mount in the same package a control circuit 33 comprised of a low-voltage semiconductor circuit driven by a low-voltage power supply 32 of a control/logic system and power switching elements 35H, 35L operating with large current of high voltage HV supplied from a high-voltage power supply 34. Thus, there are few industrial ICs and modules used widely. In other words, power ICs and modules formed by the Si semiconductor technology at present are formed with quite complicated processes using an insulating technique for electrically isolating the low-voltage element and the high-voltage element from each other.

Particularly in a semiconductor device called Intelligent Power Module (IPM), a gate drive circuit 36 for high-side power switching element 35H of power switching elements (e.g., Insulated Gate Bipolar Transistors (IGBT) and Metal Oxide Semiconductor Field Effect Transistors (MOSFET)) in the inverter for controlling a motor 31 or the like should operate in a high-potential state floated from a ground potential, and a floating high-potential power supply 37 is then required.

The reason for this is that the potential at a connection portion between high-side power switching element 35H and low-side power switching element 35L connected to a load always varies depending on the states of these power switching elements and the gate potential for high-side power switching element 35H has to be supplied with respect to the varied potential in order to control the switching. Therefore, a level shift technique is required in which a signal on the basis of the ground potential sent from control circuit 33 is passed to gate drive circuit 36 in the high-potential floating state.

Typically employed as a level shift circuit for driving an Si power element in a conventional inverter is a scheme using a photocoupler as shown in FIG. 10. In this scheme, an LED (Light Emitting Diode) 39 emits light in response to a signal on the basis of the ground potential sent from control circuit 33, and a photodiode 38 is irradiated with the light. Then, the gate of high-side power switching element 35H is controlled depending on the signal of potential caused in photodiode 38 by the light irradiation. Use of a photocoupler in this manner allows a signal to be transmitted to gate drive circuit 36 in the high-potential floating state.

However, such a photocoupler is required for each high-side power switching element. In a three-phase output drive circuit in FIG. 10, for example, there are needed at least three photocouplers and three high-side gate drive power supplies. On the other hand, a gate drive circuit 40 for low-side power switching elements 35L is a low-voltage circuit and does not require such three independent floated power supplies as needed for the high-side. In other words, voltage from one low-side power supply 41 is supplied to three low-side power switching elements 35L by drive circuit 40 for inverter control.

As described above, the inverter as shown in FIG. 10 requires three power switching elements 35H, three gate drive circuits 36, three floating power supplies 37, and three level shift circuits (photodiodes 38, LEDs 39) on the high side and requires a certain capacity for mounting them, thereby disadvantageously increasing the size of the module containing them.

In view of the aforementioned problem in the power module shown in FIG. 10, Japanese Patent Laying-Open No. 2006-073775 proposes a method of improving heat resistance of a light-receiving element by forming both of a power switching element and the light-receiving element using wide-bandgap semiconductor, and also reducing a chip area by forming the power switching element and the light-receiving element on the same semiconductor chip.

However, in the method proposed in Japanese Patent Laying-Open No. 2006-073775, an LED for emitting light having a shorter wavelength than blue light has to be used to drive the light-receiving element, which causes increase in cost of the module.

More specifically, when a light-receiving element for producing a signal for driving a power semiconductor device is formed using a wide-bandgap semiconductor substrate, light having a wavelength shorter than the wavelength of blue light needs to be applied to excite the wide-bandgap semiconductor, as a signal light for exciting the light-receiving element. An LED that can emit light having such a short wavelength is generally fabricated using nitride semiconductor and is thus expensive, resulting in cost increase of the module.

Moreover, the wide-bandgap semiconductor element is liable to contain many defects, and it is difficult to control impurity diffusion for controlling electrical polarity. Therefore, it is also difficult to produce a high-performance light-receiving element with high sensitivity as well as good characteristics regarding such noise as dark current.

SUMMARY OF THE INVENTION

In view of the problems in the prior art as described above, an object of the present invention is to provide at low cost a semiconductor device including a power switching element formed using wide-bandgap semiconductor and a high-performance light-receiving element for controlling the same.

According to the present invention, a semiconductor device includes: a photodiode formed using a silicon substrate; a wide-bandgap semiconductor layer disposed on the silicon substrate and having a bandgap larger than that of silicon; and a switching element formed using the wide-bandgap semiconductor layer. The switching element is electrically connected to the photodiode to be on/off-controlled by a control signal from the photodiode.

In this semiconductor device, the photodiode has a cathode-side electrode and an anode-side electrode, and the switching element has a first electrode, a second electrode, and a control electrode. The cathode-side electrode of the photodiode may be electrically connected to the first electrode of the switching element, and the anode-side electrode of the photodiode may be electrically connected to the control electrode of the switching element.

It is preferable to include a plurality of photodiodes electrically connected to each other in series in order to improve the capability of reliably controlling the switching element. It is also preferable to further include an amplification circuit that is formed using the silicon substrate to amplify and provide the control signal from the photodiode to the switching element. This amplification circuit may be electrically connected so as to amplify voltage between the cathode-side electrode and the anode-side electrode of the photodiode and apply the amplified voltage between the first electrode and the control electrode of the switching element.

The wide-bandgap semiconductor layer may include at least any of a GaN layer, an AlGaN layer, an InGaN layer, and an InAlGaN layer. The wide-bandgap semiconductor layer can also include an SiC layer.

In a case where the photodiode is covered with the wide-bandgap semiconductor layer, a shield electrode connected to a ground electrode for shielding the photodiode from electromagnetic noise is preferably provided on the wide-bandgap semiconductor layer in an upper region of the photodiode.

In a case where the switching element formed using the wide-bandgap semiconductor layer is an FET, it is preferable that a gate electrode of the FET is a Schottky gate and the FET is a normally-off type.

In a method of manufacturing the semiconductor device as described above, it is preferable that an impurity diffusion process is performed on the silicon substrate to form the light-receiving element, and the wide-bandgap semiconductor layer is thereafter epitaxially grown on the silicon substrate. Preferably, the silicon substrate includes a first kind of through groove and a second kind of through groove that penetrate the substrate. The first kind of through groove is a groove for forming an electrode passing through the silicon substrate, and the second kind of through groove is a groove for forming an isolation region passing through the silicon substrate. Insulating films are formed at the same time on inner surfaces of both kinds of through grooves. The first kind of through groove has a width in which a space for forming an electrode can be left even after formation of the insulating film, and the second kind of through groove has a width that is filled with the insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
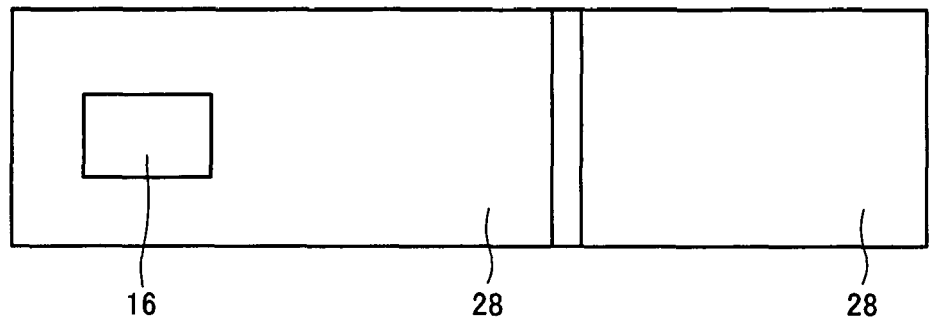
FIG. 1A is a schematic plan view showing a semiconductor device according to an embodiment of the present invention.
Figure 1B:
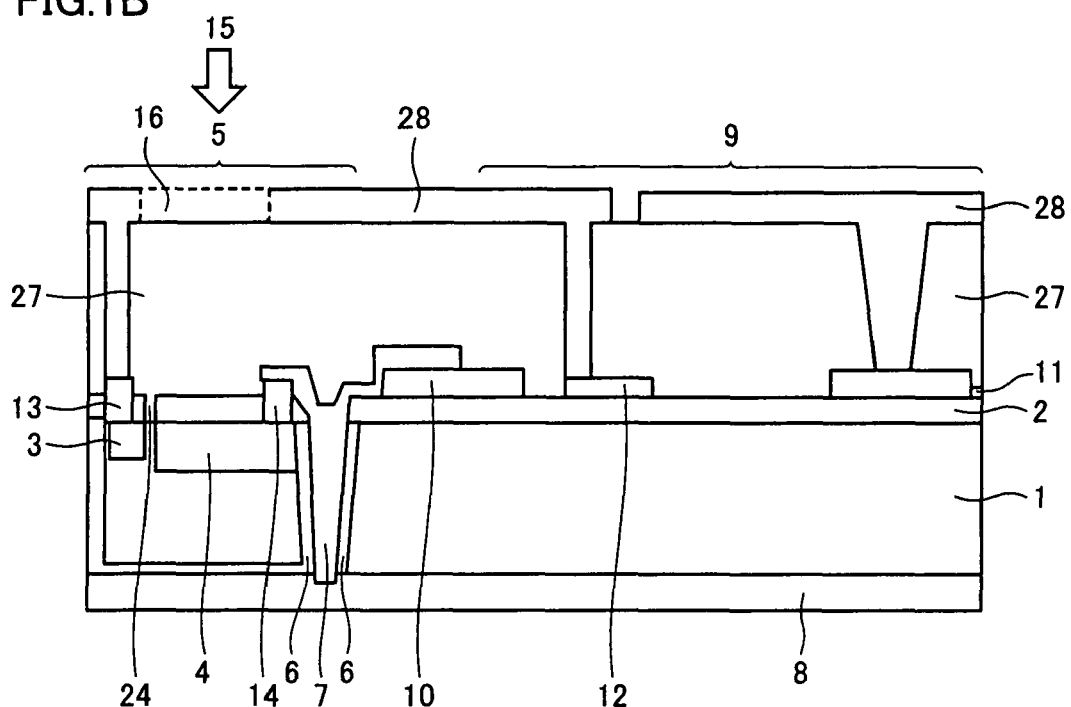
FIG. 1B is a schematic cross-sectional view of the semiconductor device of FIG. 1A.
Figure 1C:
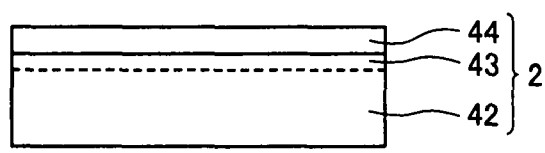
FIG. 1C is an enlarged schematic cross-sectional view showing an epitaxial AlGaN/GaN layer included in FIG. 1B.

FIG. 1A and FIG. 1B schematically show a plan view and a cross sectional view, respectively, of a semiconductor device according to a first embodiment of the present invention, and FIG. 1C shows an enlarged cross section of an epitaxial AlGaN/GaN layer included in FIG. 1B. It is noted that in the drawings of the present application, the length, width, thickness and the like are arbitrarily changed for the sake of clarity and brevity of the drawings and do not represent the actual dimensional relation. In the drawings, the same reference characters represent the same parts or corresponding parts.

In the semiconductor device of FIG. 1B, a light-receiving element 5 includes a p-type diffusion region 3 and an n-type diffusion region 4 formed in an upper surface layer of a silicon substrate 1. These diffusion regions are isolated from electrodes 7, 8 by an insulating film 6.

On the other hand, a switching element 9 is formed using an epitaxial AlGaN/GaN layer 2 and has a source electrode 10, a drain electrode 11 and a gate electrode 12. This gate electrode 12 is formed of a Schottky electrode, and switching element 9 is capable of a normally-off operation by a built-in voltage.

Here, as shown in FIG. 1C, epitaxial AlGaN/GaN layer 2 has an AlGaN layer 43 stacked on a GaN layer 42. In this case, in a boundary region between GaN layer 42 and AlGaN layer 43, a two-dimensional electron gas layer 44 is formed on the GaN layer side having a narrow bandgap.

P-type diffusion region 3 of light-receiving element 5 is electrically connected to gate electrode 12 of switching element 9 through an anode electrode 13 and a connection electrode 28. On the other hand, n-type diffusion region 4 of light-receiving element 5 is electrically connected to source electrode 10 of switching element 9 through a cathode electrode 14 and a connection electrode 7.

When light 15 from an LED (not shown) for control is introduced through an opening 16 of connection electrode 28 into light-receiving element 5, photoelectromotive force is caused therein. This photoelectromotive force is transmitted as a control signal to gate electrode 12 so that switching element 9 switches current in response to the control signal.

Here, switching element 9 is a normally-off type with the built-in voltage of Schottky electrode 12, and the threshold voltage of switching element 9 can thus be set to about 0.3 V. Then, switching element 9 having such a low threshold voltage can be controlled by even one light-receiving element 5.

Figure 2:
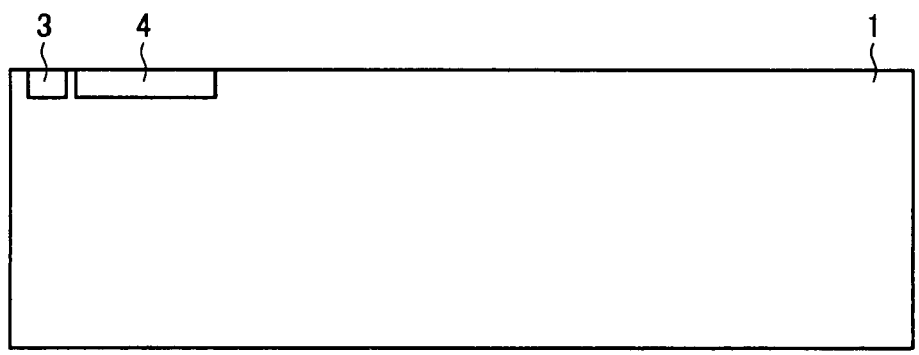
FIG. 2 is a schematic cross-sectional view illustrating a method of manufacturing the semiconductor device of FIG. 1B.
Figure 3:
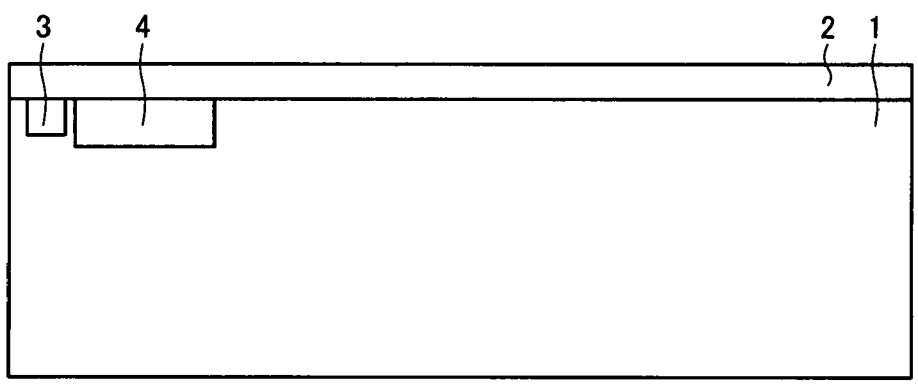
FIG. 3 is a schematic cross-sectional view illustrating a manufacturing step following FIG. 2.

FIG. 2 to FIG. 6 illustrate an exemplary process of manufacturing the semiconductor device of FIG. 1B in schematic cross-sectional views. First, as shown in FIG. 2, p-type diffusion region 3 and n-type diffusion region 4 are formed slightly spaced apart from each other in a surface layer of an upper main surface of silicon substrate 1 by ion injection or any other method. Thereafter, as shown in FIG. 3, epitaxial AlGaN/GaN layer 2 is grown on the upper main surface of silicon substrate 1. The temperature of silicon substrate 1 is increased by heat during the epitaxial growth so that impurity diffusion of p-type diffusion region 3 and n-type diffusion region 4 is developed.

Figure 4:
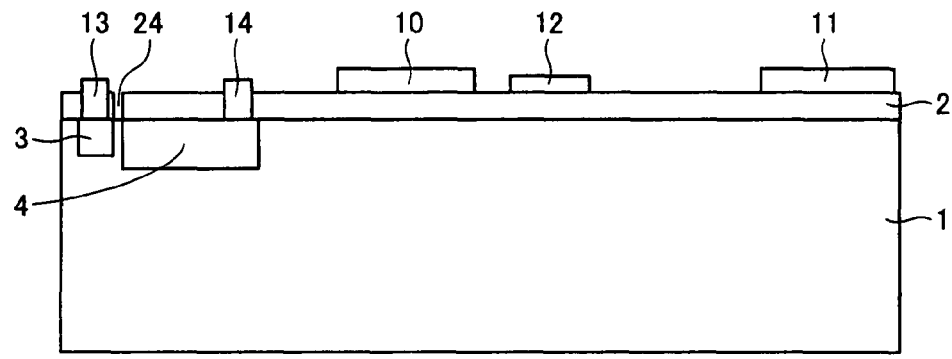
FIG. 4 is a schematic cross-sectional view illustrating a manufacturing step following FIG. 3.

In FIG. 4, there are formed source electrode 10, drain electrode 11 and gate electrode 12 for switching element 9 as well as anode electrode 13 and cathode electrode 14 for light-receiving element 5. Then, AlGaN/GaN epitaxial layer 2 covering silicon substrate 1 is separated by a groove 24 between p-type diffusion region 3 and n-type diffusion region 4 for light-receiving element 5.

Figure 5:
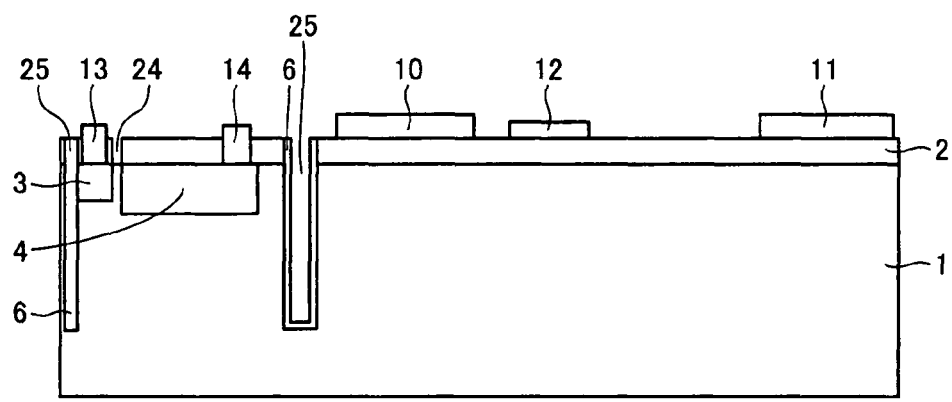
FIG. 5 is a schematic cross-sectional view illustrating a manufacturing step following FIG. 4.

In FIG. 5, grooves 25 are formed to have a prescribed depth in silicon substrate 1, and insulating film 6 is formed on an inner wall of each of grooves 25. Here, if the width of groove 25 is made smaller than twice the thickness of insulating film 6, then groove 25 is filled with insulating film 6 and can be used as an insulating region for element-isolation. On the other hand, if the width of groove 25 is made larger than twice the thickness of insulating film 6, then a space is left inside insulating film 6 covering the inner wall of groove 25 and connection electrode 7 can be formed in the space. In other words, insulating film 6 for element-isolation and insulating film 6 for insulating connection electrode 7 can be formed at the same time in silicon substrate 1 by adjusting the widths of grooves 25 as appropriate.

Figure 6:
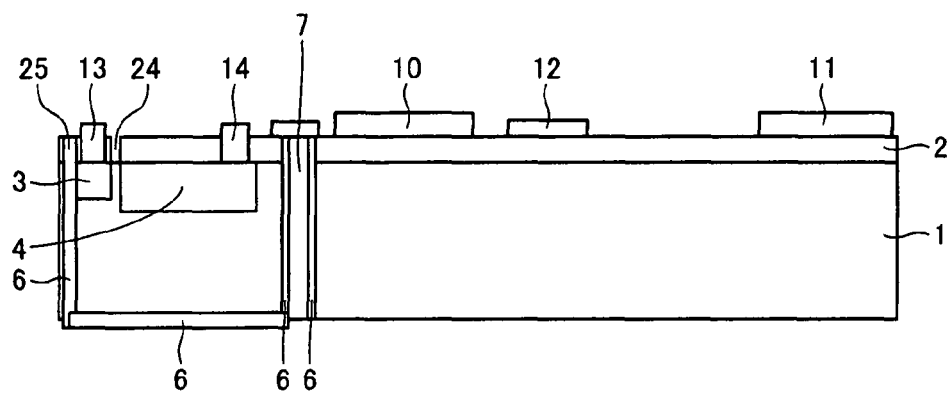
FIG. 6 is a schematic cross-sectional view illustrating a manufacturing step following FIG. 5.

In FIG. 6, the lower surface of silicon substrate 1 is polished until connection electrode 7 is exposed, and insulating film 6 is formed on the bottom surface of light-receiving element portion 5. The switching element and the light-receiving element are bonded to each other by insulating layer 6 and connection electrode 7 and are not separated from each other. Thereafter, as shown in FIG. 1B, electrode 8 on the lower surface of silicon substrate 1 is formed in contact with connection electrode 7. In addition, an insulating film 27 covering the upper side of substrate 1 is formed and connection electrode 28 is formed thereon, so that the semiconductor device according to the first embodiment can be realized.

In the present invention, since the switching element is formed of wide-bandgap semiconductor, it causes less electric loss and less heat generation. Furthermore, influence of heat generated in the switching element on the light-receiving element can be minimized since the light-receiving element and the switching element are completely isolated from each other by groove 25.

In this embodiment, while AlGaN/GaN layer 2 covers the light-receiving element, it is epitaxially grown on silicon substrate 1 and allows light in the wavelength range from infrared to red light to pass through and furthermore it can function as a protection film for the light-receiving element. However, since insulating film 27 provided above the light-receiving element can function as a protection film, AlGaN/GaN layer 2 may be removed if desired.

In such a case, it is possible to form the light-receiving element after removal of AlGaN/GaN layer 2 by diffusing impurities in silicon substrate 1. Here, the temperature of impurity diffusion in silicon substrate 1 may be about 1000° C. to 1150° C. The epitaxial growth of the GaN layer may be performed at 1100° C. in MOCVD (Metal Organic Chemical Vapor Deposition) or at about 900° C. in MBE (Molecular Beam Epitaxy).

Second Embodiment

Figure 7:
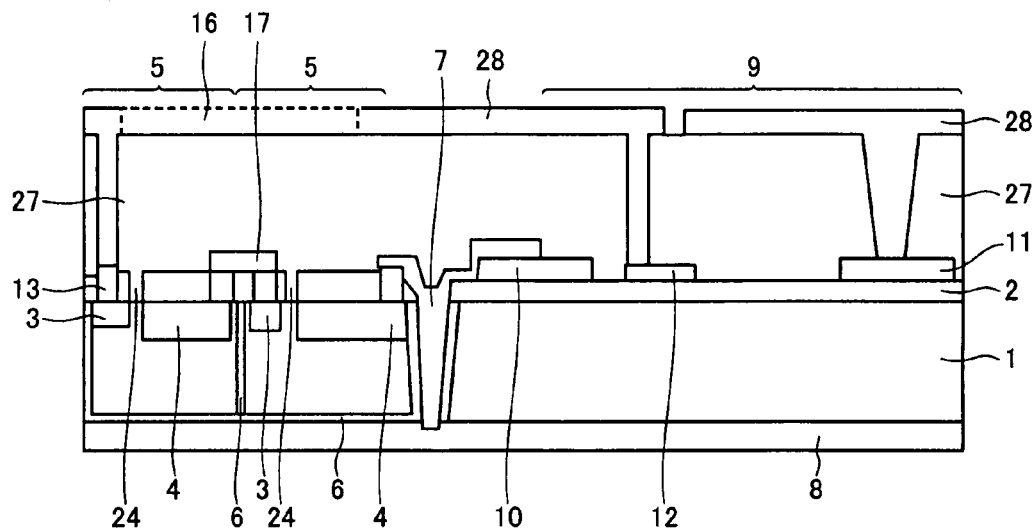
FIG. 7 is a schematic cross-sectional view showing a semiconductor device according to another embodiment of the present invention.

FIG. 7 shows in schematic cross section a semiconductor device according to a second embodiment of the present invention. The semiconductor device of the second embodiment differs from that of the first embodiment only in that it includes a plurality of light-receiving elements 5.

More specifically, the semiconductor device of FIG. 7 includes two light-receiving element regions 5. Two light-receiving element regions 5 are isolated from each other by insulating film 6 therebetween. Each of the isolated light-receiving element regions 5 includes a pair of p-type diffusion region 3 and n-type diffusion region 4. Then, these light-receiving element regions 5 are electrically coupled to each other in series by a connection electrode 17.

Therefore, in the semiconductor device according to the second embodiment, a high-voltage control signal is provided from two light-receiving elements 5 connected in series to gate electrode 12 of switching element 9, so that the reliability in control of switching element 9 is improved as compared with the first embodiment. Here, although FIG. 7 shows two light-receiving elements 5, it is needless to say that three or more light-receiving elements may be connected in series.

Since the light-receiving element and the switching element are electrically isolated completely from each other in this embodiment also, the control voltage can be increased.

Third Embodiment

Figure 8:
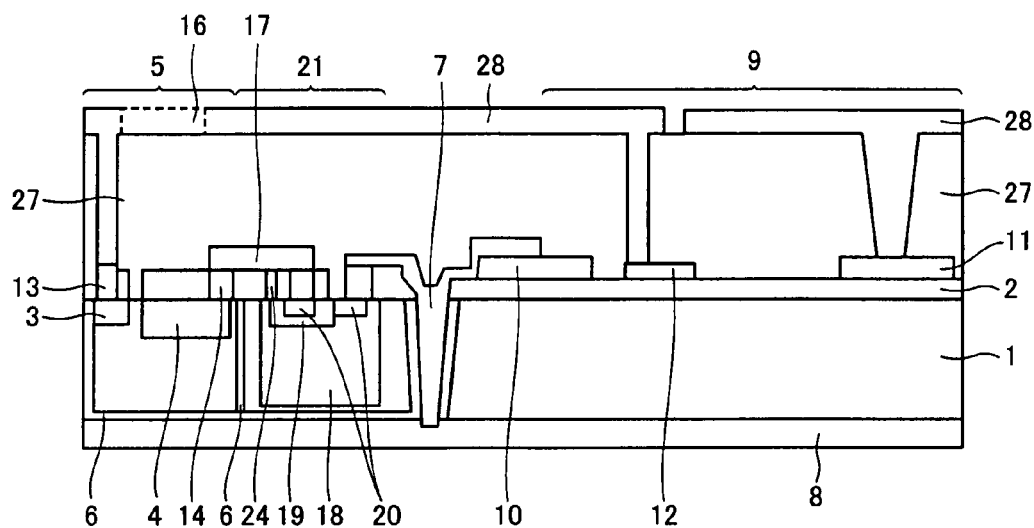
FIG. 8 is a schematic cross-sectional view showing a semiconductor device in accordance with a further embodiment of the present invention.

FIG. 8 shows in schematic cross section a semiconductor device according to a third embodiment of the present invention. The semiconductor device of the third embodiment differs from that of the first embodiment only in that it includes a signal amplification portion 21 between light-receiving element 5 and switching element 9.

More specifically, the semiconductor device of FIG. 8 includes an n-type diffusion region 18, a p-type diffusion region 19 and a pair of $n^+$ type diffusion regions 20 formed in silicon substrate 1 to form a bipolar transistor as signal amplification portion 21.

Bipolar transistor 21 is electrically connected so as to amplify voltage between cathode-side electrode 14 and anode-side electrode 13 of photodiode 5 and apply the amplified voltage between source electrode 10 and gate electrode 12 of switching element 9. Specifically, one of a pair of $n^+$ type diffusion regions 20 of bipolar transistor 21 is connected to n-type diffusion region 4 of photodiode 5 through connection electrode 17 and the other is connected to source electrode 10 of switching element 9 through connection electrode 7.

Therefore, in the semiconductor device according to the third embodiment, a control signal from light-receiving element 5 is amplified by bipolar transistor 21 and is then provided to gate electrode 12 of switching element 9, so that the reliability in control of switching element 9 is improved as compared with the first embodiment. Here, although a bipolar transistor is illustrated as signal amplification portion 21 in FIG. 8, it may be replaced with any other appropriate amplification circuit. In addition, if desired, it is possible to fabricate a semiconductor device including both of a plurality of light-receiving elements 5 connected in series in the second embodiment and signal amplification portion 21 in the third embodiment.

Fourth Embodiment

Figure 9A:
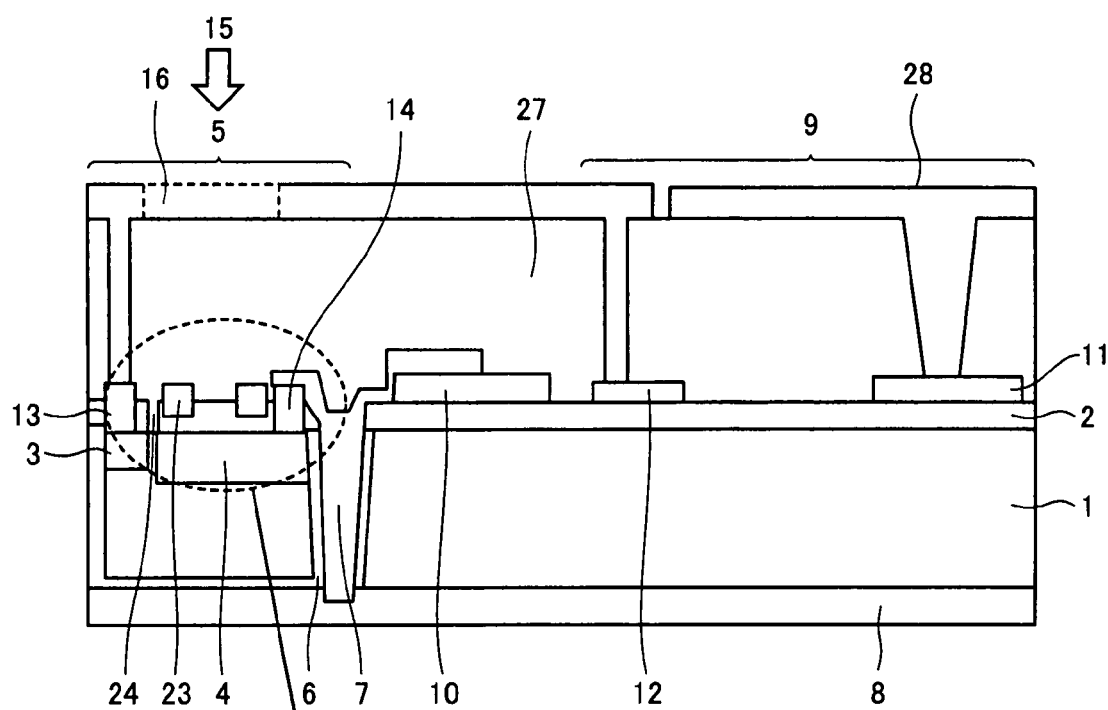
FIG. 9A is a schematic cross-sectional view showing a semiconductor device according to a still further embodiment of the present invention.
Figure 9B:
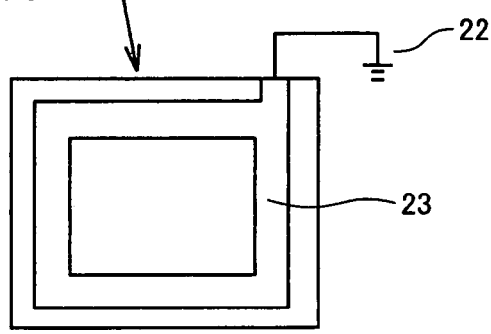
FIG. 9B is an enlarged schematic plan view showing an ellipse region surrounded by a broken line in FIG. 9A.
Figure 10:
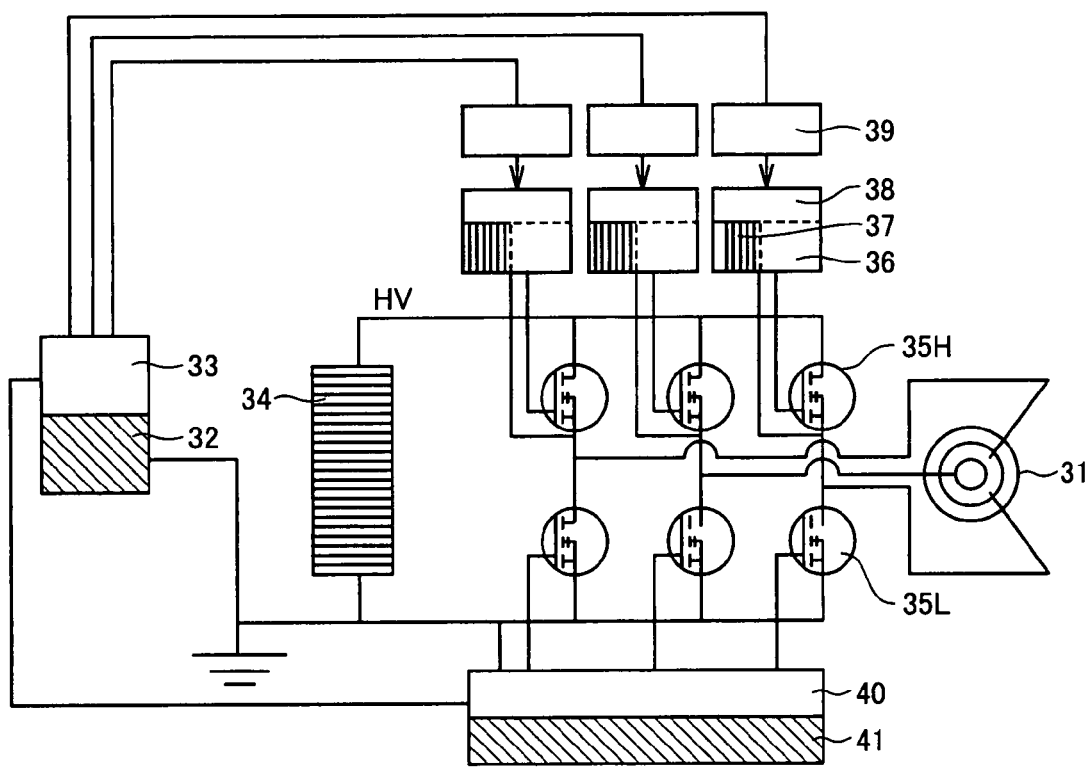
FIG. 10 is a schematic block diagram showing an example of a power semiconductor module according to the prior art.

FIG. 9A shows in schematic cross section a semiconductor device according to a fourth embodiment of the present invention. FIG. 9B is an enlarged plan view schematically showing an ellipse region surrounded by a broken line in FIG. 9A. The semiconductor device of the fourth embodiment differs from that of the first embodiment only in that a shield electrode 23 for shielding a photodiode from electromagnetic noise is provided on wide-bandgap semiconductor layer 2 in the upper region of the photodiode. Shield electrode 23 is connected to a ground electrode 22 to which source electrode 10 of switching element 9 is connected.

In the fourth embodiment, AlGaN/GaN layer 2 allows light having a wavelength in the range from infrared to red light to pass through and a two-dimensional electron gas layer is formed in the GaN layer, so that provision of shield electrode 23 of low resistance make it possible to remove noise coming from the outside of the semiconductor device and realize higher CMR (common mode rejection). It is needless to say that such a shield electrode may additionally be provided in each of the semiconductor devices of the first to third embodiments.

In each of the foregoing embodiments, epitaxial AlGaN/GaN layer 2 may be replaced with a multilayer of AlN and GaN layers, or a single layer of AlGaN, GaN, InGaN and InAlGaN or a multi-layered film having a combination thereof. Furthermore, an SiC layer may be formed in place of epitaxial AlGaN/GaN layer 2. In this case, a silicon semiconductor process may be shared for processing silicon substrate 1 and the SiC layer, thereby further reducing the manufacturing costs of the semiconductor device.

Although the foregoing description has been given only to the case where a switching element is monolithically formed on a silicon substrate, it is needless to say that a switching element may be fabricated separately and then connected to a silicon substrate having a light-receiving element formed therein by flip chip bonding.

As described above, in the semiconductor device according to the present invention, a light-receiving element is formed using a silicon substrate, so that the light-receiving element can be driven by an LED for emitting light in the wavelength range from infrared to red light. Then, a switching element formed using wide-bandgap semiconductor can be controlled by the light-receiving element. In other words, for control of the power semiconductor device according to the present invention, an inexpensive LED for emitting light of a relatively longer wavelength may be used rather than an expensive LED for emitting light of a shorter wavelength, whereby making it possible to lower the price of a power semiconductor module. In addition, the use of a silicon substrate facilitates fabrication of a high-performance light-receiving element.

Moreover, a shield layer which allows LED light to pass through and does not allow electromagnetic noise to pass through can be formed by grounding a two-dimensional electron gas layer in the wide-bandgap layer, and a high CMR photodiode can be realized by forming a silicon photodiode under the wide-bandgap layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a photodiode formed using a silicon substrate;
   a wide-bandgap semiconductor layer disposed on said silicon substrate and having a bandgap larger than that of silicon; and
   a switching element formed using said wide-bandgap semiconductor layer, wherein
   said switching element is electrically connected to said photodiode to be on/off-controlled by a control signal from said photodiode, and
   wherein said photodiode is covered with said wide-bandgap semiconductor layer.

2. The semiconductor device according to claim 1, wherein
   said photodiode has a cathode-side electrode and an anode-side electrode,
   said switching element has a first electrode, a second electrode, and a control electrode,
   said cathode-side electrode of said photodiode is electrically connected to said first electrode of said switching element, and
   said anode-side electrode of said photodiode is electrically connected to said control electrode of said switching element.

3. The semiconductor device according to claim 1, further comprising one or more additional photodiodes electrically connected in series between said photodiode and said switching element.

4. The semiconductor device according to claim 1, further comprising an amplification circuit formed using said silicon substrate and amplifying and providing said control signal from said photodiode to said switching element.

5. The semiconductor device according to claim 4, wherein
   said photo diode has a cathode-side electrode and an anode-side electrode,
   said switching element has a first electrode, a second electrode, and a control electrode, and
   said amplification circuit is electrically connected so as to amplify voltage between said cathode-side electrode and said anode-side electrode of said photodiode and apply the amplified voltage between said first electrode and said control electrode of said switching element.

6. The semiconductor device according to claim 1, wherein said wide-bandgap semiconductor layer includes at least any of a GaN layer, an Al GaN layer, an InGaN layer, and an InAlGaN layer.

7. The semiconductor device according to claim 1, wherein a shield electrode arranged to surround a periphery of said photodiode and electrically connected to a ground electrode is provided on said wide-bandgap semiconductor layer in an upper region of said photodiode.

8. The semiconductor device according to claim 1, wherein said switching element formed using said wide-bandgap semiconductor layer is an FET, a gate electrode of said FET is a Schottky gate, and said FET is a normally-off type.

9. A method of manufacturing a semiconductor device, said method comprising:
   providing a photodiode formed using a silicon substrate;
   providing a wide-bandgap semiconductor layer disposed on said silicon substrate and having a bandgap larger than that of silicon; and
   providing a switching element formed using said wide-bandgap semiconductor layer, wherein said switching element is electrically connected to said photodiode to be on/off-controlled by a control signal from said photodiode, and wherein said photodiode is covered with said wide-bandgap semiconductor layer,
wherein
   an impurity diffusion process is performed on said silicon substrate to form said light-receiving element, and said wide-bandgap semiconductor layer is thereafter epitaxially grown on said silicon substrate.

10. The method of manufacturing the semiconductor device according to claim 9, wherein
said silicon substrate includes a first kind of through groove and a second kind of through groove which penetrate the substrate,
said first kind of through groove is a groove for forming an electrode passing through said silicon substrate,
said second kind of through groove is a groove for forming an isolation region passing through said silicon substrate,
insulating films are formed at the same time on inner surfaces of said both kinds of through grooves,
said first kind of through groove has a width in which a space for forming an electrode is left even after formation of said insulating film, and
said second kind of through groove has a width that is filled with said insulating film.

11. A semiconductor device comprising:
at least one photodiode including diffusion regions provided in a first portion of a silicon substrate;
a wide-bandgap semiconductor layer disposed on said silicon substrate, the wide-band gap semiconductor layer having a bandgap larger than that of silicon; and
a switching element including said wide-bandgap semiconductor layer formed over a second portion of said silicon substrate, the switching element further including a control element responsive to a control signal provided from said at least one photodiode to provide on/off control of said switching element,
wherein said at least photodiode is covered with said wide-bandgap semiconductor layer.

12. The semiconductor device according to claim 11, wherein
said at least one photodiode has a cathode-side electrode and an anode-side electrode,
said switching element has a first electrode, a second electrode, and a control electrode acting as said control element,
said cathode-side electrode of said at least one photodiode is electrically connected to said first electrode of said switching element, and
said anode-side electrode of said at least one photodiode is electrically connected to said control electrode of said switching element.

13. The semiconductor device according to claim 11, further comprising one or more additional photodiodes electrically connected in series between said at least one photodiode and said control element of said switching element.

14. The semiconductor device according to claim 11, further comprising an amplification circuit formed on said silicon substrate and amplifying and providing said control signal from said at least one photodiode to said control element of said switching element.

15. The semiconductor device according to claim 14, wherein
said at least one photodiode has a cathode-side electrode and an anode-side electrode,
said switching element has a first electrode, a second electrode, and a control electrode acting as said control element, and
said amplification circuit is electrically connected so as to amplify voltage between said cathode-side electrode and said anode-side electrode of said photodiode and to apply the amplified voltage between said first electrode and said control electrode of said switching element.

16. The semiconductor device according to claim 11, wherein said wide-bandgap semiconductor layer includes at least one of a GaN layer, an AlGaN layer, an InGaN layer, and an InAlGaN layer.

17. The semiconductor device according to claim 11, further comprising a shield electrode arranged to surround a periphery of said at least one photodiode, said shield electrode being electrically connected to a ground electrode and being provided on said wide-bandgap semiconductor layer in an upper region of said at least one photodiode.

18. The semiconductor device according to claim 11, wherein said switching element formed using said wide-bandgap semiconductor layer is an FET, a gate electrode of said FET is a Schottky gate and functions as said control element, and said FET is a normally-off type.

* * * * *